(12) United States Patent
Alexander

(10) Patent No.: US 10,193,659 B2
(45) Date of Patent: Jan. 29, 2019

(54) WIRELESS RECEIVER

(71) Applicant: Cohda Wireless Pty Ltd., North Adelaide (AU)

(72) Inventor: Paul Dean Alexander, North Adelaide (AU)

(73) Assignee: Cohda Wireless Pty Ltd., North Adelaide (AU)

( * ) Notice: Subject to any disclaimer, the term of this patent is extended or adjusted under 35 U.S.C. 154(b) by 0 days.

(21) Appl. No.: 15/362,364

(22) Filed: Nov. 28, 2016

(65) Prior Publication Data

US 2017/0155474 A1    Jun. 1, 2017

(30) Foreign Application Priority Data

Nov. 27, 2015   (AU) ................................ 2015904909

(51) Int. Cl.
| | |
|---|---|
| *H04L 27/06* | (2006.01) |
| *H03K 9/00* | (2006.01) |
| *H03D 1/00* | (2006.01) |
| *H04L 1/00* | (2006.01) |

(Continued)

(52) U.S. Cl.
CPC .......... *H04L 1/0054* (2013.01); *H03M 13/41* (2013.01); *H03M 13/4169* (2013.01);
(Continued)

(58) Field of Classification Search
USPC ...... 375/240, 240.26–240.28, 219, 220, 211, 375/240.24, 259, 262, 265, 264, 263, 286,
(Continued)

(56) References Cited

U.S. PATENT DOCUMENTS

| | | | |
|---|---|---|---|
| 7,277,506 B1 | 10/2007 | Pope et al. | |
| 7,298,778 B2* | 11/2007 | Visoz ..................... | H04B 1/712 375/148 |

(Continued)

OTHER PUBLICATIONS

"Australian Application No. 2015904909, Search Report dated Oct. 21, 2016", (Oct. 21, 2016), 7 pgs.

*Primary Examiner* — Linda Wong
(74) *Attorney, Agent, or Firm* — Schwegman Lundberg & Woessner, P.A.

(57) ABSTRACT

The present invention relates to a method and apparatus for channel estimation between a transmitter and a receiver in a wireless communications system. In one arrangement, the method comprises: receiving at the receiver a first sequence of bits representing a first sequence of coded symbols transmitted over the communications channel; decoding the first sequence of coded symbols using maximum-likelihood based decoding including: generating traceback outcomes by tracing backwards the first sequence of bits through a maximum-likelihood based traceback path, the traceback outcomes including a first portion associated with a first traceback depth and a second portion associated with a second traceback depth that is deeper than the first traceback depth; generating a channel estimate of the communications channel based on the first portion of the traceback outcomes; and generating an estimate of at least some information bits coded in the first sequence of coded symbols based on the second portion of the traceback outcomes.

18 Claims, 9 Drawing Sheets

(51) Int. Cl.
    *H04L 25/02* (2006.01)
    *H03M 13/41* (2006.01)
    *H03M 13/00* (2006.01)
    *H04L 25/03* (2006.01)
    *H04L 27/26* (2006.01)
    *H03M 13/11* (2006.01)
    *H03M 13/29* (2006.01)
    *H04L 1/20* (2006.01)

(52) U.S. Cl.
    CPC ...... *H03M 13/6337* (2013.01); *H04L 25/024* (2013.01); *H04L 25/03203* (2013.01); *H04L 25/03292* (2013.01); *H03M 13/1102* (2013.01); *H03M 13/2957* (2013.01); *H03M 13/6362* (2013.01); *H04L 1/208* (2013.01); *H04L 27/2649* (2013.01)

(58) Field of Classification Search
    USPC ........ 375/316, 324, 340, 341, 343, 346, 356
    See application file for complete search history.

(56) References Cited

U.S. PATENT DOCUMENTS

| | | | |
|---|---|---|---|
| 7,688,888 B2* | 3/2010 | Brown | H04L 25/03057 375/229 |
| 8,397,148 B2 | 3/2013 | Shi et al. | |
| 8,948,321 B2 | 2/2015 | Eliaz et al. | |
| 2006/0239342 A1* | 10/2006 | Amizic | H04L 25/0212 375/233 |
| 2007/0104264 A1* | 5/2007 | Park | H04L 1/0071 375/233 |
| 2007/0183489 A1* | 8/2007 | Zhidkov | H03M 13/256 375/229 |
| 2007/0237263 A1* | 10/2007 | Strolle | H04H 20/28 375/321 |
| 2008/0008233 A1* | 1/2008 | Cohen | H04L 25/0212 375/232 |
| 2008/0008272 A1* | 1/2008 | Yang | H03M 13/2933 375/341 |
| 2008/0175309 A1* | 7/2008 | Fimoff | H04L 25/03019 375/232 |
| 2010/0269026 A1* | 10/2010 | Yang | H03M 13/4138 714/792 |
| 2011/0243212 A1* | 10/2011 | Kim | H04L 25/03057 375/232 |
| 2011/0268168 A1* | 11/2011 | Dybdal | H04L 25/03171 375/225 |
| 2013/0198594 A1* | 8/2013 | Catthoor | H03M 13/256 714/792 |
| 2014/0056387 A1* | 2/2014 | Asahina | H04L 1/006 375/340 |
| 2016/0164633 A1* | 6/2016 | Avner | H04L 1/0054 375/233 |

* cited by examiner

WIRELESS RECEIVER

CLAIM OF PRIORITY

This application claims the benefit of priority of Australia Patent Application No. 2015904909, filed on Nov. 27, 2015, the benefit of priority of which is claimed hereby, and which is incorporated by reference herein in its entirety.

FIELD OF THE INVENTION

The present invention relates to a method and apparatus for channel estimation in a wireless communications system.

BACKGROUND OF THE INVENTION

In OFDM based communications systems operating in mobile outdoor radio environments it is advantageous to use decoder outcomes to assist with estimating a communications channel Decoder outcomes are outcomes from a decoder including estimates of the underlying information bit stream and, in some cases, estimates of the output from the corresponding encoder. The estimated channel can then be used to demodulate the received signal, even if the channel is changing during receipt of a data packet.

A data packet typically includes a known initial segment, called a preamble, that allows an initial channel estimate to be formed. A channel estimator uses this preamble-based channel estimate to decode at least the earlier parts of the payload (i.e. the data bearing segment of the data packet following the preamble). Once decoding is performed on the earlier parts of the payload, the channel estimate may be updated based on the decoder outcomes, and may therefore be tracked during receipt of later parts of the payload.

Reference to any prior art in the specification is not, and should not be taken as, an acknowledgment or any form of suggestion that this prior art forms part of the common general knowledge in any jurisdiction or that this prior art could reasonably be expected to be understood, regarded as relevant and/or combined with other pieces of prior art by a person skilled in the art.

SUMMARY OF THE INVENTION

According to a first aspect of the invention there is provided a method of estimating a communications channel between a transmitter and a receiver, the method comprising: receiving at the receiver a first sequence of bits representing a first sequence of coded symbols transmitted over the communications channel; decoding the first sequence of coded symbols using maximum-likelihood based decoding including: generating traceback outcomes by tracing backwards the first sequence of bits through a maximum-likelihood based traceback path, the traceback outcomes including a first portion associated with a first traceback depth and a second portion associated with a second traceback depth that is deeper than the first traceback depth; generating a channel estimate of the communications channel based on the first portion of the traceback outcomes; and generating an estimate of at least some information bits coded in the first sequence of coded symbols based on the second portion of the traceback outcomes.

The first portion may be subject to a first information bit error rate (BER) and the second portion may be subject to a second information BER that is lower than the first information BER.

The method may further comprise disregarding any estimate of the information bits generated based on the first portion of the traceback outcomes.

The step of generating a channel estimate of the communications channel may commence after generation of the first portion of the traceback outcomes and before completion of generation of the second portion of the traceback outcomes.

The step of generating an estimate of information bits may commence after completion of generation of the second portion of the traceback outcomes.

The traceback outcomes may include a third portion that is associated with a third traceback depth that is shallower than the second traceback depth, and that is subject to a third information BER that is higher than the first information BER, and the method may further comprise: disregarding any estimate of information bits generated based on the third portion of the traceback outcomes; and disregarding any estimate of a transmitted coded symbol generated based on the third portion of the traceback outcomes.

The step of generating a channel may include generating an estimate of at least one of the first sequence of transmitted coded symbols based on the first portion of the traceback outcomes.

The step of generating a channel may include: generating an estimate of information bits coded in the coded symbols based on the first portion of the traceback outcomes; and re-encoding the estimate of the information bits to form re-encoded symbols.

The method may further comprise: receiving at the receiver a second sequence of bits representing a second sequence of coded symbols and including at least part of the first sequence of bits; decoding the second sequence of coded symbols using maximum-likelihood based decoding including: generating further traceback outcomes by tracing backwards the second sequence of bits through a maximum-likelihood based traceback path, the further traceback outcomes including a fourth portion associated with a fourth traceback depth and a fifth portion associated with a fifth traceback depth that is deeper than the fourth traceback depth, generating an updated channel estimate of the communications channel based on the fourth portion of the further traceback outcomes; and generating an estimate of at least some information bits coded in the second sequence of coded symbols based on the fifth portion of the further traceback outcomes. The method may further comprise disregarding any estimate of the information bits generated based on the fourth portion of the further traceback outcomes.

The further traceback outcomes may include a sixth portion that is associated with a sixth traceback depth that is shallower than the fourth traceback depth, and that is subject to a sixth information BER that is higher than the fourth information BER, the method further comprising: disregarding any estimate of information bits generated based on the sixth portion of the further traceback outcomes; and disregarding any estimate of a transmitted coded symbol generated based on the sixth portion of the further traceback outcomes.

The second and/or the fifth traceback depth may be no less than approximately 7N, where N is the encoding constraint length.

Any one or more of the first portion, the second portion correspond to one or more OFDM symbols, the fourth portion and the fifth portion may correspond to one or more OFDM symbols.

The first and/or the second sequence of coded bits may be encoded using a convolutional code.

The method may further comprise generating soft bits based the first and/or the second sequence of bits for the decoding.

According to a second aspect of the invention, there is provided an apparatus for estimating a communications channel between a transmitter and a receiver, the apparatus comprising: an input configured to receive a first sequence of bits representing a first sequence of coded symbols transmitted over the communications channel; a decoder configured to decode the first sequence of coded symbols using maximum-likelihood based decoding by at least: generating traceback outcomes by tracing backwards the first sequence of bits through a maximum-likelihood based traceback path, the traceback outcomes including a first portion associated with a first traceback depth and a second portion associated with a second traceback depth that is deeper than the first traceback depth; and generating an estimate of at least some information bits coded in first sequence of the coded symbols based on the second portion of the traceback outcomes, and a channel estimator configured to generate a channel estimate of the communications channel based on the first portion of the traceback outcomes.

Further aspects of the present invention and further embodiments of the aspects described in the preceding paragraphs will become apparent from the following description, given by way of example and with reference to the accompanying drawings.

DETAILED DESCRIPTION OF EMBODIMENTS
INTRODUCTION

Figure 1:
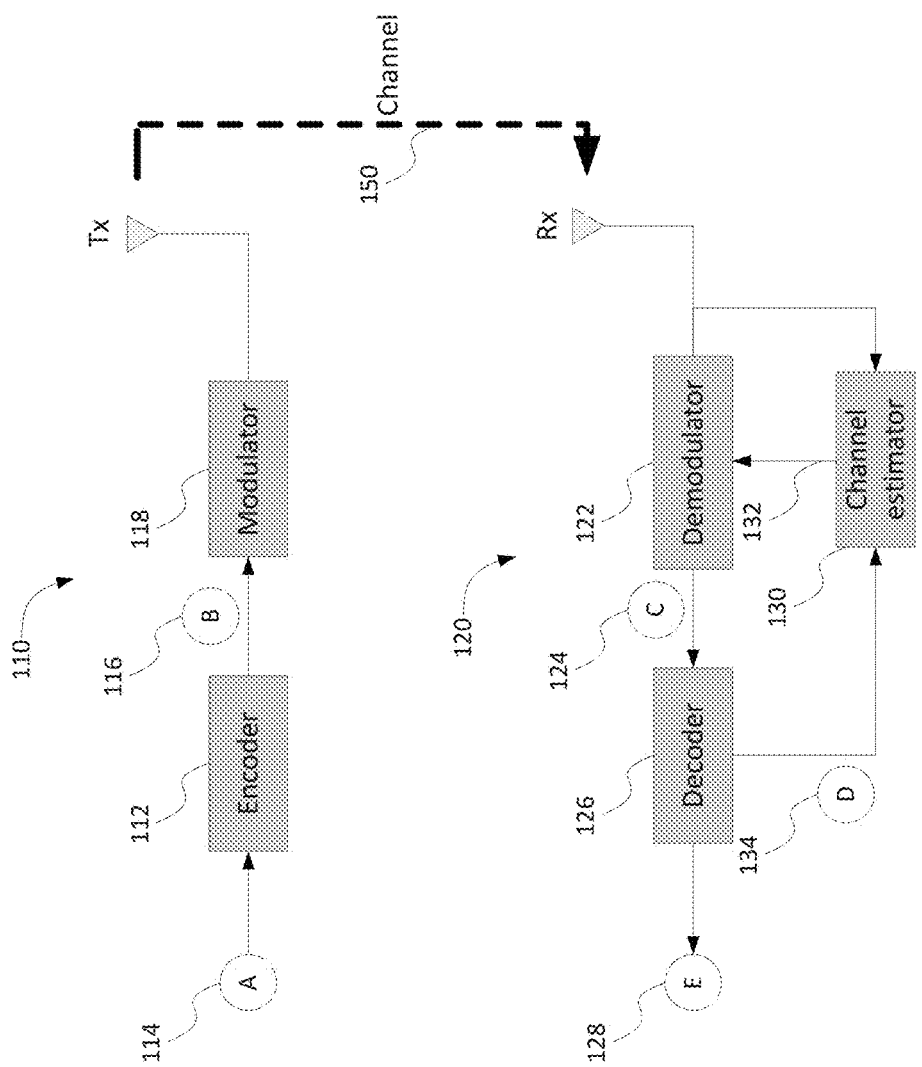
FIG. 1 illustrates a schematic diagram of a communications system including a transmitter, a receiver and a communication channel.

Described herein are a method and an apparatus for estimation of a wireless communications channel between a transmitter 110 and a receiver 120. FIG. 1 illustrates a simplified schematic diagram of a communications system. As illustrated in FIG. 1, the transmitter 110 includes an encoder 112 which encodes input information bits 114 into coded bits 116, and a modulator 118 which modulates the coded bits 116 into a suitable signal format at radio-frequency (RF) frequencies for wireless transmission as a via a transmitting antenna. The RF signal is transmitted wirelessly through a communications channel 150. In practice, the effects of the communication channel 150 are to distort the RF signal by, for example, introducing noise, timing jitters and frequency offsets. The role of the encoder 112 is to add redundancy to the transmitted data so that errors due to such signal distortions can be corrected after the distorted RF signal is received and demodulated at the receiver 120.

At the receiver 120, a receiving antenna receives the distorted RF signal. The receiver 120 includes a demodulator 122 to demodulate the received RF signal to generate received bits 124. The received bits 124 generally differ from the coded bits 116 due to the signal distortions. The receiver 120 also includes a decoder 126 to decode the received bits. The decoding process generates an estimate 128 of the information bits 114 by essentially reversing the operation of decoder and, in doing so, attempting to recover the information bits 114 by counteracting the effects of the signal distortions. The following description refers particularly to convolutional coding but is applicable to other types of coding, such as turbo coding and low-density parity-check (LDPC) coding.

A skilled person would appreciate that, for simplification, there may be other components which are omitted from FIG. 1, such as an interleaver/de-interleaver, a scrambler/descrambler, a data/symbol mapper, fast Fourier transform (FFT) or inverse FFT units and a puncturer/depuncturer.

One or more of the components of the receiver 120 may be implemented as software, such as a computer program including instructions stored in a non-transitory computer-readable medium and executable by the one or more processors. In one example, the non-transitory computer-readable medium is a memory or storage module, such as volatile memory including a random access memory (RAM), non-volatile memory including read-only memory (ROM), or a harddisk. The one or more processors may be one or more computer processing units (CPUs). Alternatively or additionally the one or more of the components of the receiver 120 may be implemented as hardware, such as using one or more digital signal processors (DSPs), application-specific integrated circuits (ASICs) or field-programmable gate arrays (FPGAs).

To improve the accuracy of the information bit estimate 128 generated by the decoder 126, the receiver 120 may include a channel estimator 130 to at least partially compensate the effects of the channel As mentioned in the background, the channel estimator 130 may initially rely on the preamble of the received packet to provide a channel estimate 132 to assist the demodulator 122 to demodulate at least the earlier parts of the payload (i.e. the data bearing segment of the data packet following the preamble). Once decoding is performed on the earlier parts of the payload, the channel estimator 130 may update the channel estimate 132 based on the decoder outcomes (i.e. the information bit estimate 128 which are then re-encoded and/or the estimates 134 of the coded bits) as they are released from the decoder 126. Updated channel estimates 132, which reflect more accurate or changed channel characteristics, may then be provided to the demodulator 122 for use in demodulating the later parts of the payload.

Figure 2:
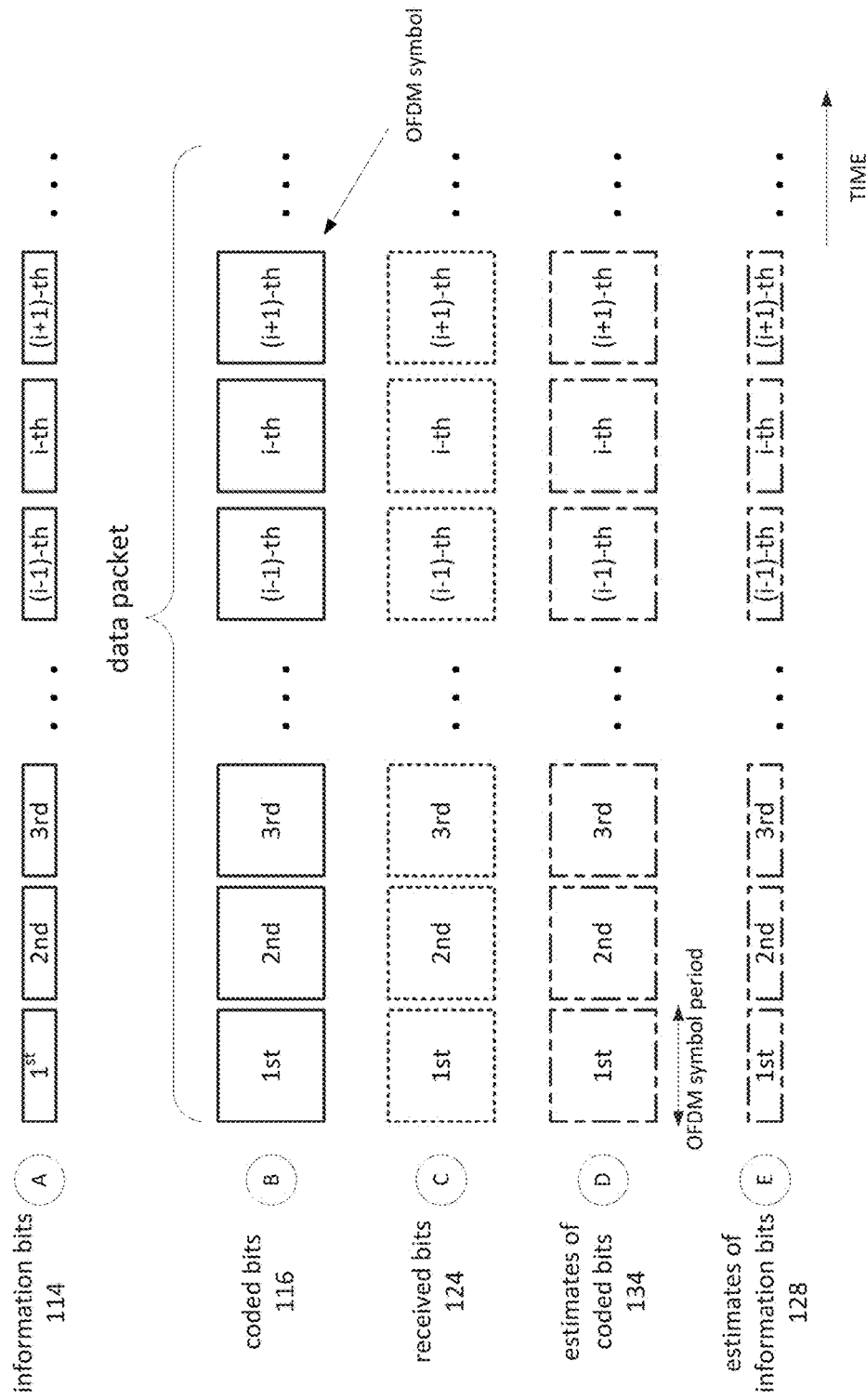
FIG. 2 illustrates schematically a time representation of data bits at various points in an orthogonal frequency division multiplexing (OFDM) based system.

In orthogonal frequency division multiplexing (OFDM) communication systems, each data packet is encoded and modulated to include multiple OFDM symbols. As FIG. 2 illustrates, each OFDM symbol corresponds to a block or set of information bits 114 at the transmitter 110 to be encoded by the encoder 112 as well as corresponding to their estimates generated by the decoder 126. In some cases, each set of received bits 124 is processed in the receiver 120 on a symbol-by-symbol basis. In others, the received bits 124 may be processed other than on a symbol-by-symbol basis. For example, received bits 124 may be processed in blocks of multiple symbol and/or multiple subcarriers, or processed based on the entire packet. In the description that follows, a receiver processing received bits on a symbol-by-symbol basis is described, but a skilled person would appreciate that similar principles apply to a receiver which processes received bits on a basis other than a symbol-by-symbol basis.

Traceback

At the decoder 126, decoder outcomes include estimates 128 of the information bits 114 (hereinafter "information bit estimate(s)") as well as estimates 134 of the coded bits 116 (hereinafter "coded bit estimate(s)"). As illustrated in FIG. 1, the coded bit estimate 134 may be provided to the channel estimator 130 for generating an updated channel estimate 132. Decoder outcomes are released based on traceback outcomes generated in a traceback process (or trellis traceback). The traceback process is described in further detail as follows using Viterbi decoding as an example, though a skilled person would appreciate that the description is applicable to any maximum-likelihood based decoding.

Figure 3A:
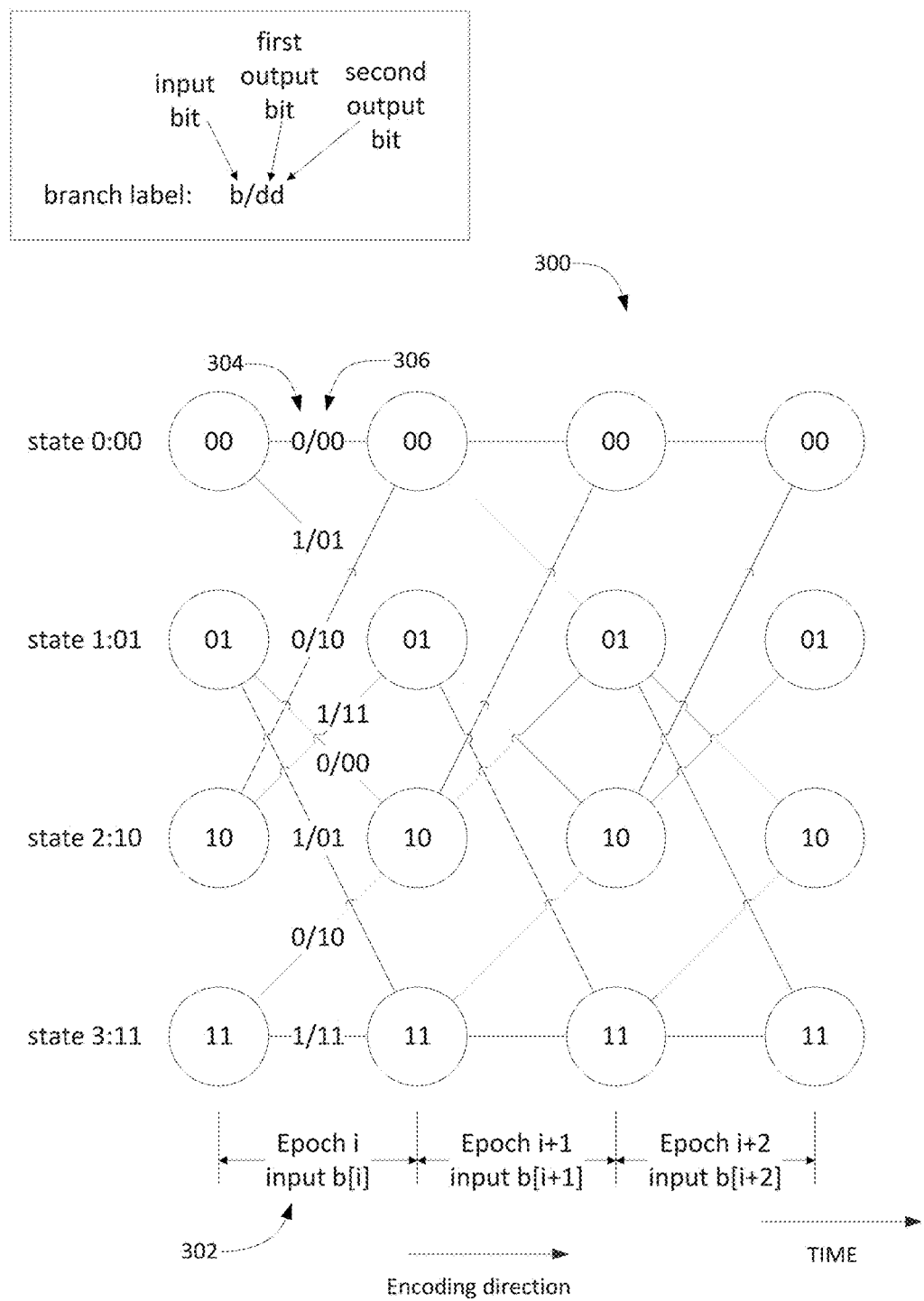
FIGS. 3A and 3B each illustrate a partial trellis diagram for a 4-state rate-1/2 convolutional coding scheme.

FIG. 3A illustrates a partial trellis 300 corresponding to a section of an OFDM symbol for a 4-state rate-1/2 code. In some embodiments, when a received OFDM symbol is processed at the receiver 120, a block of "soft bits" pertaining to that OFDM symbol may be generated and provided to the decoder 126, such as a Viterbi decoder. The Viterbi decoder is a finite-state machine that allows it to update survivor metrics with this new block of "soft bits". The state of the decoder is advanced by a number of epochs 302 equal to the number of information bits 114 encoded into the OFDM symbol. On each branch of the trellis are two pieces of information—the input label 304 and the output label 306. In the case of a rate-1/2 code, the input label 304 corresponds to a single information bit (b) and the output label 306 consists of two coded bits (dd). The input label bits are useful to the higher layers of the stack (e.g. according to the layer of stacks in the Open Systems Interconnection (OSI) model) and are passed up for further processing. The output label bits are those used to, in the case of quadrature amplitude modulation (QAM), select I/Q symbols at the transmitter and are therefore of interest to the channel estimator 130 for generating channel estimates.

Figure 3B:
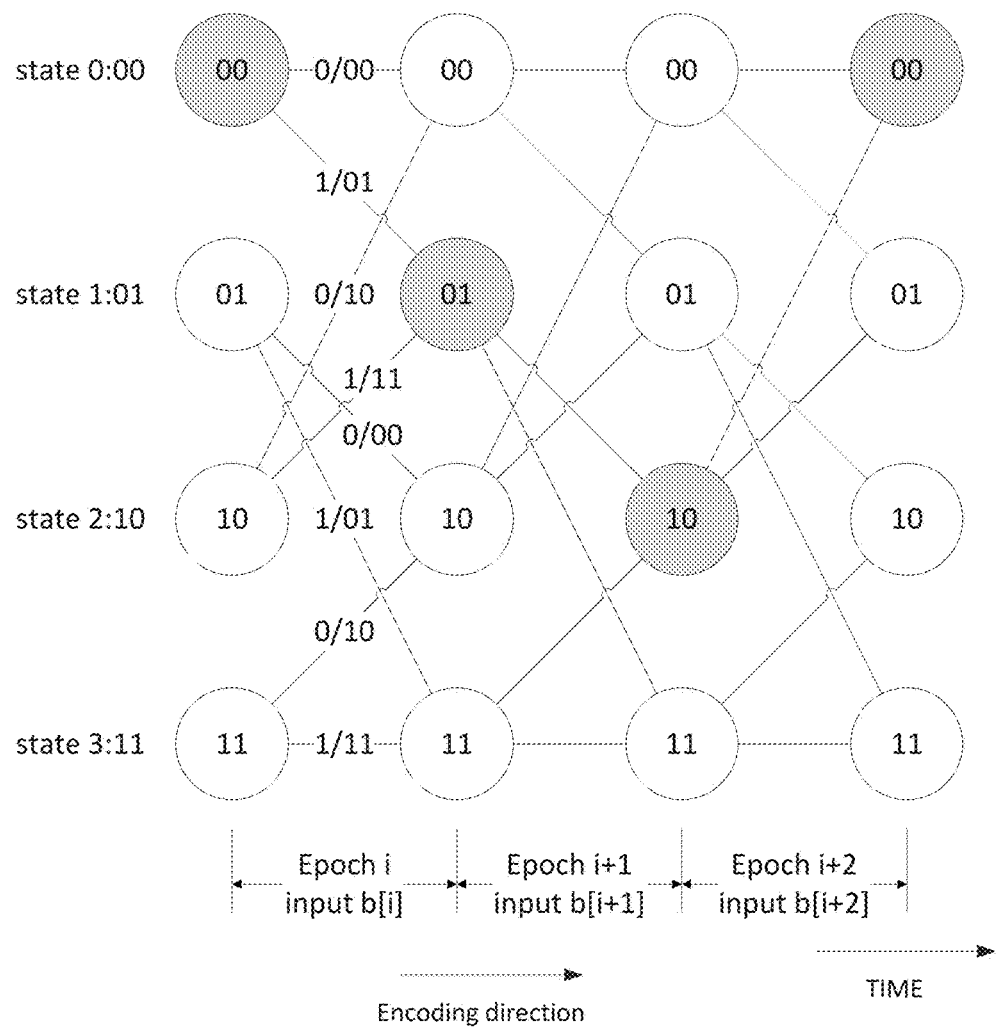

From the encoding perspective, each encoder epoch 302 towards the right in FIG. 3A corresponds to a new input (b) taken sequentially from the information bits 114 into the encoder 112, resulting in a set of output bits (dd) forming the coded bits 116 and a new state (00, 01, 10 or 11). The output bits (dd) are a function of the current state and the new input (b) Similarly, the new state is also a function of current state and the new input. For example, in a 4-state rate-1/2 code, as illustrated in FIG. 3B, each new input bit (b) results in a transition to a new state and an output of two bits (dd) dependent on the original state and the input bit (b). For the example of FIG. 3B, starting from an initial state 00, the input bits of 110 cause traversal of the encoder 112 to states 01, 10 and 00, producing output bits 01 00 10. A skilled person would appreciate that these state transitions and output bits can be expressed by look-up tables or a trellis.

From the decoding perspective, a list of surviving paths is kept, one for each state in the trellis. Each surviving path is of a certain, common, depth. The depth is measured in a number of encoder epochs 302. In a Viterbi decoder, as a newly received OFDM symbol is processed, the surviving paths are created by adding new epochs (corresponding to the newly received OFDM symbol) to the head of the trellis memory. This may be performed by the add-compare-select accumulation of surviving paths and their associated path metrics. In some embodiments, a puncturer is used at the transmitter side to reduce the number of coded bits produced by the encoder 112 to increase the effective code rate. In these embodiments, at the receiver side, a de-puncturer inserts de-punctured bits before the received bits are decoded by the decoder 126.

Figure 4A:
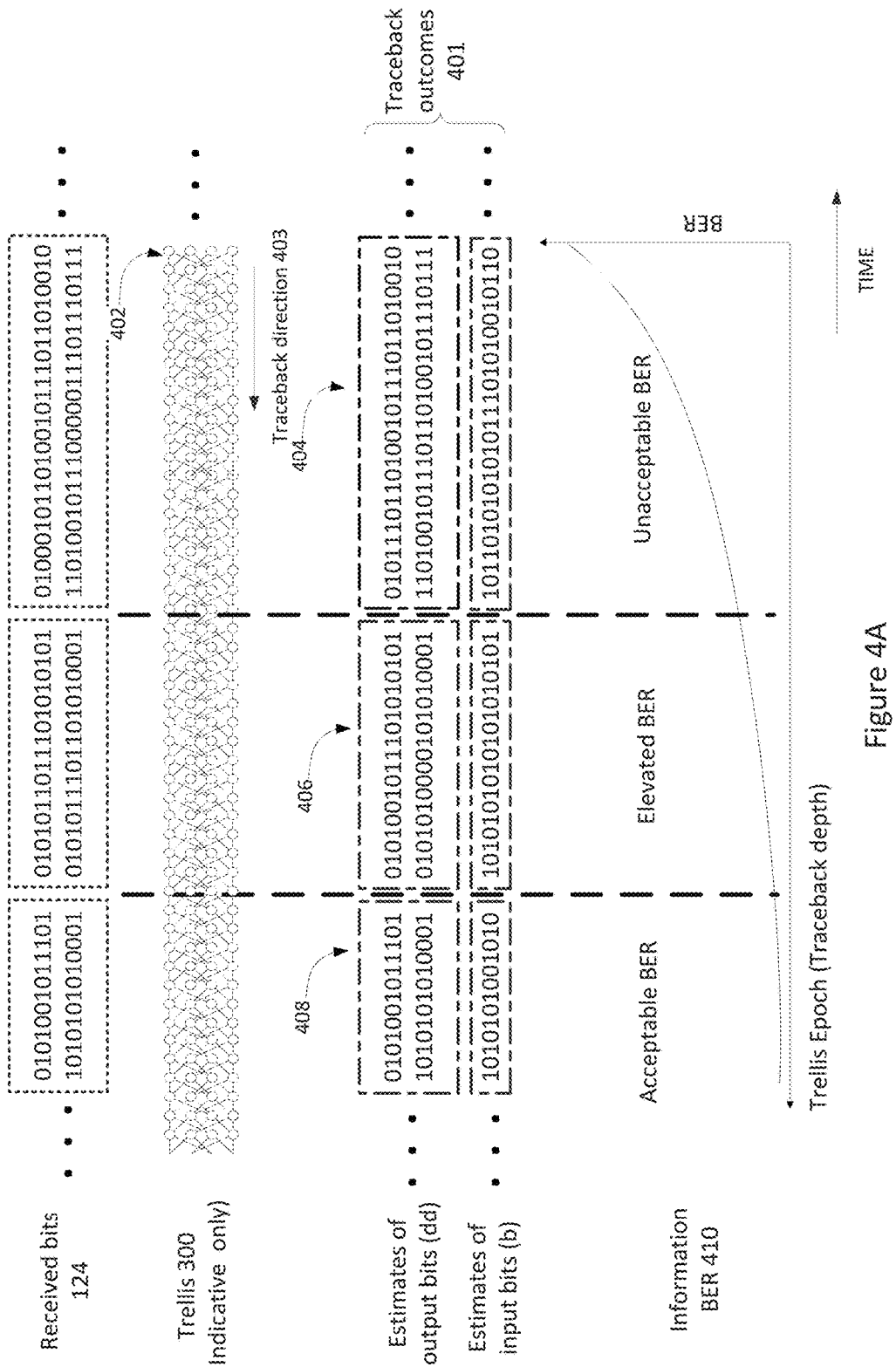
FIGS. 4A-4C each illustrate the information bit error rate (BER) as a function of traceback depth in a trellis traceback.

As illustrated in FIG. 4A, from time to time, the trellis 300 is traversed in reverse time in a traceback process to generate traceback outcomes 401, which, in the case of a 4-state rate 1/2 code, include estimates of the input bits (b) and the output bits (dd) at each encoder epoch. Estimates of the output bits (dd) correspond to estimates 134 of the coded bits 116, whereas estimates of the input bits (dd) correspond to estimates 128 of the information bits 114. In general, the traceback process begins from the end 402 of the survivor memory (i.e. from the most recently added information) and traverses this memory in the traceback direction 403 (i.e. in reverse time). Each epoch traversed corresponds to an encoder epoch which, in the case of typical OFDM standards, corresponds to a single information bit and 1 or more coded bits.

The traceback process visits a sequence of state transitions or branches contained in the Viterbi survivor memory. For each epoch a branch (corresponding uniquely to a transition between a pair of states either side of the epoch) is identified as being the transition that mostly likely occurred at the encoder 112 at this epoch. Effectively the Viterbi traceback process attempts to visit each encoder trellis branch in reverse order to that of the encoder 112 in a maximum-likelihood based path to achieve maximum-likelihood based decoding.

As each epoch is traversed in the traceback, traceback outcomes 401 can potentially be released from the decoder 126 as the decoder outcomes. However, unless the terminating state is known (e.g. in the middle of a packet), earlier-generated part(s) of the traceback outcomes 401 at shallow traceback depths may be subject to high information bit error rate (BER) 410. For example, parts 404 and 406 of the traceback outcomes 401 correspond to, respectively, an unacceptable and an elevated information BER 410. A skilled person would therefore appreciate that, in Viterbi traceback, these earlier-generated parts 404 and 406 of the traceback outcomes 401 at a shallow traceback depths are disregarded and prevented from being released as decoder outcomes since they are subject to higher information BER 410 than those generated at further or deeper traceback depths in the traceback process from a later-generated part 408 of the traceback outcomes 401, which corresponds to an acceptable information BER. That is, only selected traceback outcomes 412 may be released as decoder outcomes, whereas some traceback outcomes 414 are disregarded (see FIG. 4B).

Figure 4B:
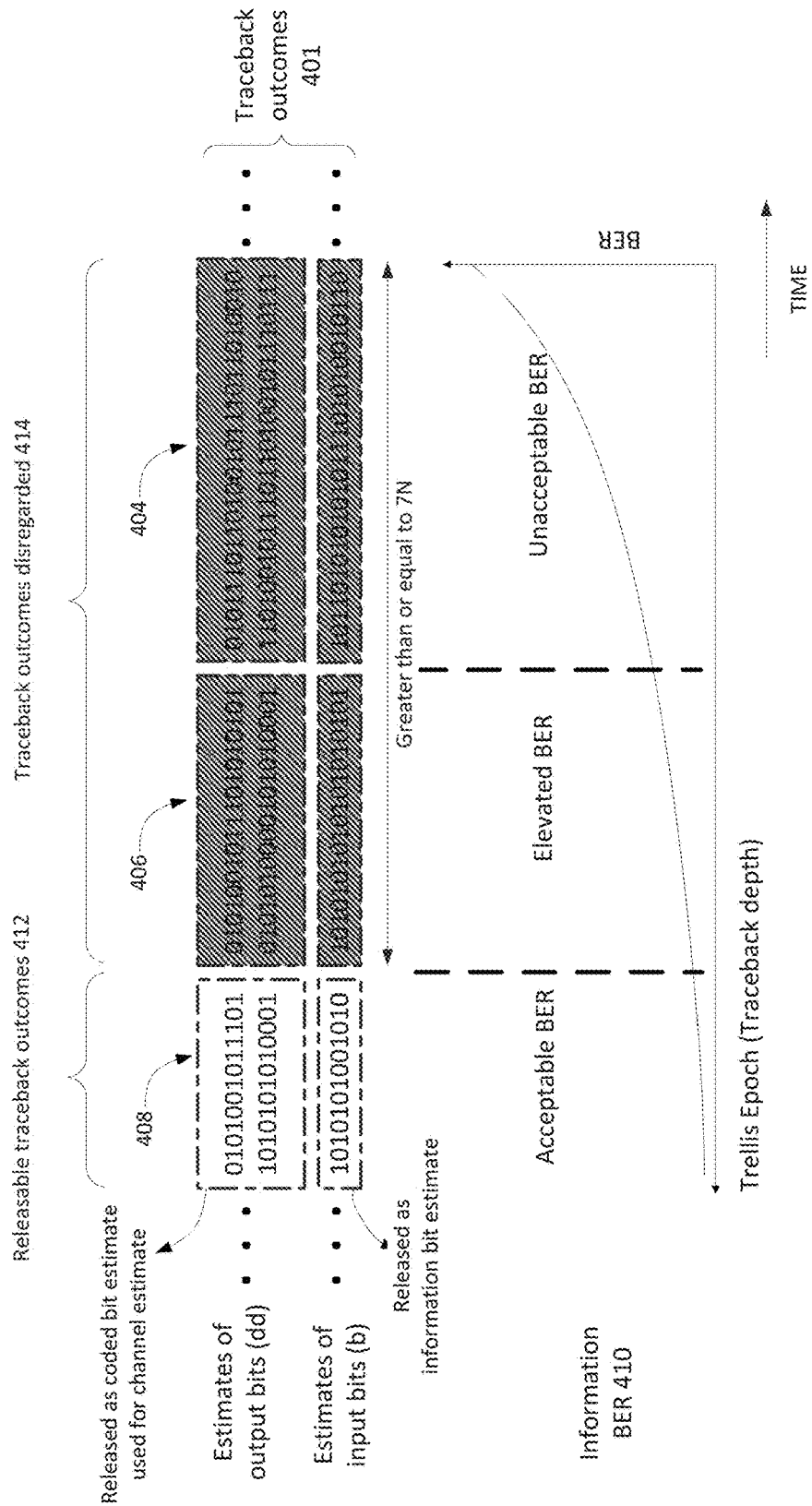

As illustrated in FIG. 4B, a known rule of thumb is to disregard or prevent release of the early-generated bits in the traceback process for generating decoder outcomes. For example, only traceback outcomes at traceback depth of 7N or greater are released, where N is the constraint length of the chosen convolutional coding. The released estimates of output bits (dd), which correspond to the coded bit estimates 134, may be provided to the channel estimator 130 and used to generate a channel estimate 132 Similarly, the released estimates of input bits (b) correspond to the information bit estimates 128. For a 64-state code, and using this rule of thumb, the first 42 bits from the traceback are disregarded and only bits traversed later in the traceback process are released as decoder outcomes. The disadvantage of holding off the release of decoder outcomes is the delay in providing updated channel estimate 132.

Release of Traceback Outcomes for Channel Estimation

The present disclosure provides that the estimates of output bits (dd) (i.e. coded bit estimate 134) for generating channel estimate 132 and the estimates of input bits (b) for generating information bit estimate 128 may be released from different parts, hence at different times, of the traceback outcomes 401.

Figure 4C:
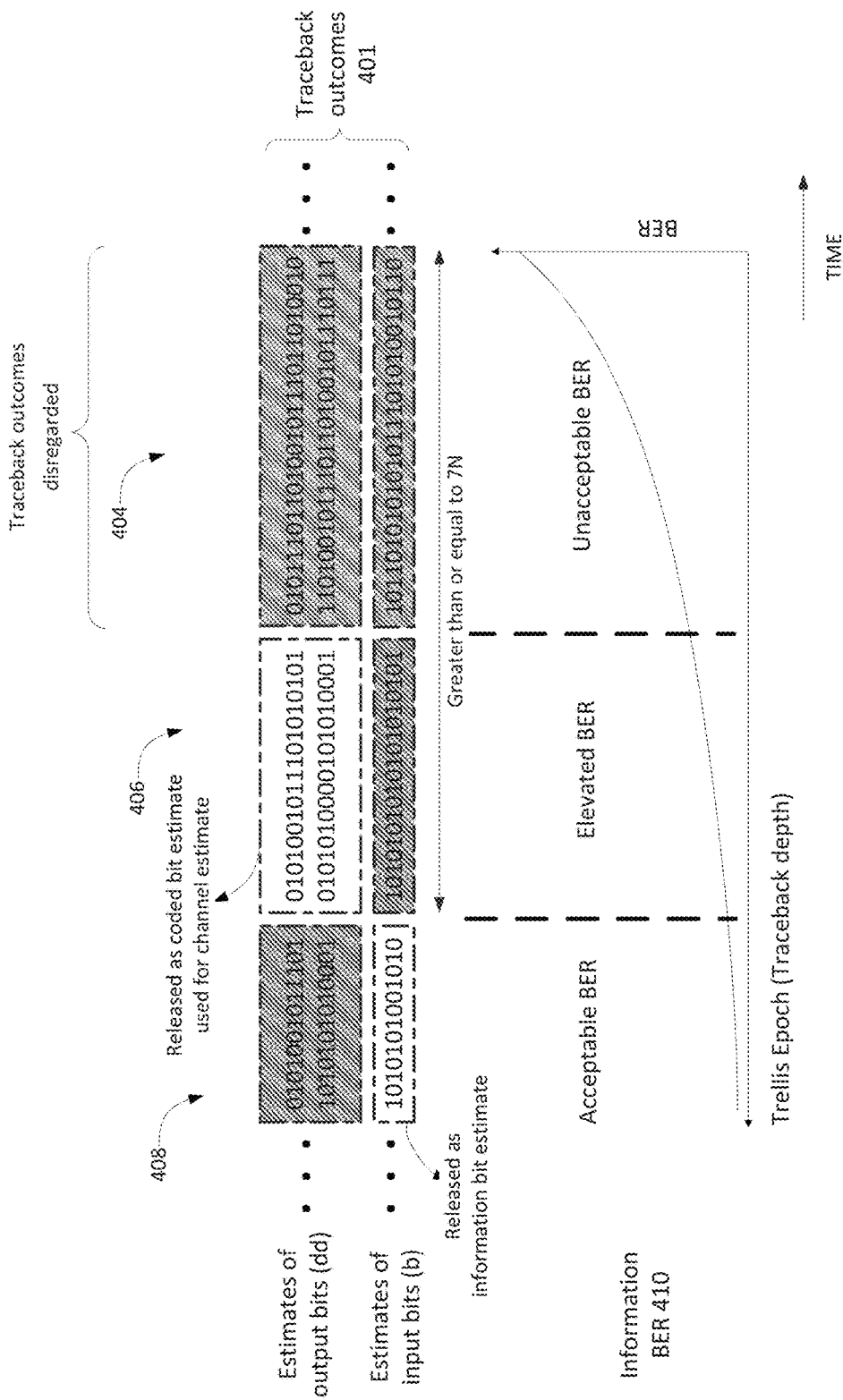

In one embodiment, as illustrated in FIG. 4C, the estimates of output bits (dd) (i.e. the coded bit estimate 134) for use by the channel estimator 130 are released from the earlier-generated part 406 of the traceback outcomes 401, which correspond to an elevated (but not unacceptable) information BER, than the later-generated part 408 of the traceback outcomes 401, which corresponds to an acceptable information BER and are released for generating the information bit estimates. As in FIG. 4B, in the embodiment illustrated in FIG. 4C, the traceback depth at which the information BER is considered acceptable may be defined by the 7N rule-of-thumb. The traceback depth at which the information BER is considered elevated (but not unacceptable) may be defined by another criteria based similarly on the traceback depth. For example, a traceback depth from 2N to 7N may be applied to identify traceback outcomes with an elevated information BER. Traceback outcomes from within the earlier-generated part 406, which corresponds to traceback depths subject to an elevated information BER, are disregarded and prevented from being released for generating any information bit estimate. Similarly, traceback outcomes 401 from within the earliest-generated part 404, which corresponds traceback depths subject to an unacceptable information BER, are still disregarded and prevented from being released for generating either estimate. As mentioned above, coded bit estimates 134 released earlier in the traceback outcomes 401 may in turn be used for generating channel estimate 132 by channel estimator 130.

Whilst the part 406 is characterised by an elevated information BER 410, the more quickly available, but reduced quality coded bit estimates 134 in the part 406 are acceptable for use in channel estimation, because the channel estimation process is understood to have increased tolerance to bit errors than the information bit estimate. For example, it is understood that a bit error in the sequence of information bits will result in media access control (MAC) frame failure due to the Frame-Check-Sequence (or FCS), whereas, in comparison, a bit error in the channel estimate training symbols is not understood to be fatal due to time and frequency domain smoothing of the channel estimate 132 and the robustness of the error control code to be applied subsequently.

The advantage of early release of traceback outcomes is that channel estimation can be started earlier than if channel estimation is generated based on coded bit estimate from later traceback outcomes. Consequently, the early release of traceback outcomes improves the delay in providing channel estimates 132.

Further, early release of traceback outcomes for channel estimation purposes has the advantage that the received OFDM symbols used for channel estimation are closer to the wavefront of the received OFDM symbols, meaning that the channel estimates used for log-likelihood ratio (LLR) calculations are less aged (i.e. "younger") than if the channel estimates are generated based on the coded bit estimate from a later part of the traceback outcomes. Relying on younger channel estimates is particularly important in mobile applications where the channel is changing rapidly during a packet.

The earlier parts 404 and 406 and the later part 408 of the traceback outcomes are generally of a different length and, in an OFDM system, each correspond to one or more OFDM symbol periods. The respective lengths of parts 404, 406 and 408 depend on the actual information BER characteristics of the communications channel in question. As illustrative examples, for a wireless link:

An acceptable information BER is below approximately $10^{-6}$.

An elevated information BER is below approximately $10^{-3}$ and above approximately $10^{-6}$.

An unacceptable information BER is approximately above $10^{-3}$.

Other BER values are also possible.

Figure 5:
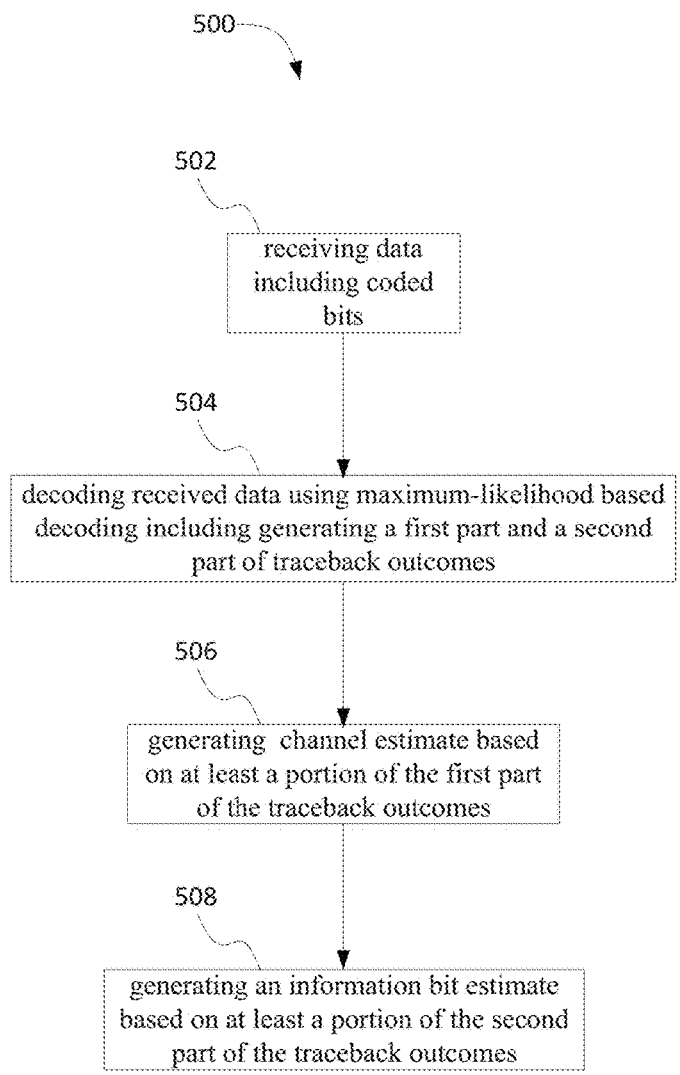
FIG. 5 illustrates a method of generating a channel estimation according to the present disclosure.

FIG. 5 illustrates a method 500 of the present disclosure in estimating the communications channel between a transmitter and a receiver. The transmitter is configured to transmit data including (i−1)-th coded bits generated by encoding (i−1)-th information bits and i-th coded bits generated by encoding i-th information bits. The (i−1)-th coded bits are earlier bits than the i-th coded bits. The (i−1)-th coded bits and the i-th coded bits may be of different length. In the case of an OFDM-based system, the (i−1)-th coded bits may include one or several OFDM symbols. Similarly, the i-th coded bits may include one or several OFDM symbols. In other words, i and (i−1) may be, but are not necessarily, treated as the OFDM symbol index.

The disclosed method includes the step 502 of receiving data including (i−1)-th received bits corresponding to the (i−1)-th coded bits and i-th received bits corresponding to the i-th coded bits. In general, the received bits and coded bits are different due to signal distortion arising from channel effects. The disclosed method also includes the step 504 of decoding the received data using maximum-likelihood based decoding, which includes generating traceback outcomes by tracing backwards through a maximum-likelihood based path across at least the i-th received bits and thereafter the (i−1)-th received bits. The generated traceback outcomes include a first part 406 corresponding to the i-th received bits and a second part 408 corresponding to the (i−1)-th received bits. Since traceback outcomes are generated in a traceback process in reverse time, the first part 406 of the traceback outcomes corresponding to the i-th received bits are generated earlier than the second part 408 of the traceback outcomes corresponding to the (i−1)-th received bits. The disclosed method also includes the step 506 of generating a channel estimate of the communications channel based on at least a portion of the first part 406 of the traceback outcomes, and the step 508 of generating an estimate of the (i−1)-th information bits based on at least a portion of the second part 408 of the traceback outcomes.

In the case of an OFDM system, in one scenario, the first part 406 (i.e. the part associated with an elevated information BER) of the traceback outcomes may be several OFDM symbols long. In this scenario, the channel estimate can be generated based on a portion of the first part 406, such as the output bits of the traceback outcomes that belong to one of the several OFDM symbols. For example, it may improve processing speed of the receiver where the channel estimate is generated based on an estimate of the OFDM symbol released earliest within the first part 406 of the traceback outcomes 410. The channel estimate may be based on any portion (e.g. the first part 406 or the second part 408), with the expectation that using a larger traceback depth introduces more latency in the processing. In another scenario, the first part 406 may be only one OFDM symbol long, in which case the channel estimate is generated based on output bits generated in the entire portion of the first part 40 of the traceback outcomes. Similarly, in one scenario, the second part 408 of the traceback outcomes 410 may be one or several OFDM symbols long.

In one arrangement, the step 506 of generating a channel estimate commences after or soon after tracing backwards through the i-th received bits and before completion of tracing backwards through the (i−1)th received bits. That is, channel estimation may commence as soon as the first part 406 of the traceback outcomes 410 is available. Early release of traceback outcomes 410 associated with elevated but not unacceptable information BER may provide early commencement of channel estimation. The step 508 of generating an estimate of the (i−1)-th information bits commences after completion of tracing backwards through the (i−1)th received bits.

More generally, and referring to FIG. 4C, generating traceback outcomes include tracing backwards through firstly (i+1)-th received bits (to generate a third part 404 of the traceback outcomes 410), then the i-th received bits (to generate the first part 406 of the traceback outcomes 410), and thereafter the (i−1)-th received bits (to generate a second part 408 of the traceback outcomes 410). The (i+1)-th received bits correspond to (i+1)-th coded bits generated at the encoder 112 based on (i+1)-th information bits. The third part 404 of the traceback outcomes 410 corresponding to the (i+1)-th received bits is however disregarded due to their association with an unacceptably high information BER. Accordingly, the step 506 of generating a channel estimate may include disregarding a third part 404 of the traceback outcomes 410 that correspond to the (i+1)-th received bits. This third part 404 is also disregarded for the purposes of generating the information bit estimate 128.

In one scenario, the length of the third part 404 or the (i+1)-th received bits is 2N. That is, only traceback outcomes beyond the length of 2N are released due to unacceptably high information BER. Other lengths of the third part 404 are also possible.

In some arrangements, the combined length of the (i+1)-th received bits and i-th received bits is no less than approximately a traceback length of approximately 7N, where N is the encoding constraint length of the chosen convolutional coding. In these arrangements, therefore, the generation of the information bit estimate 128 has at least a lag time corresponding to 7N.

Updating Channel Estimate

When one or more new symbols of a data packet are received and added to the start of the trellis memory, the method 500 may be repeated to provide an updated channel estimate by commencing from the new start of the trellis memory. Each iteration of the method 500 also advances the position of the data packet at which the information bit estimate can be provided.

Figure 6:
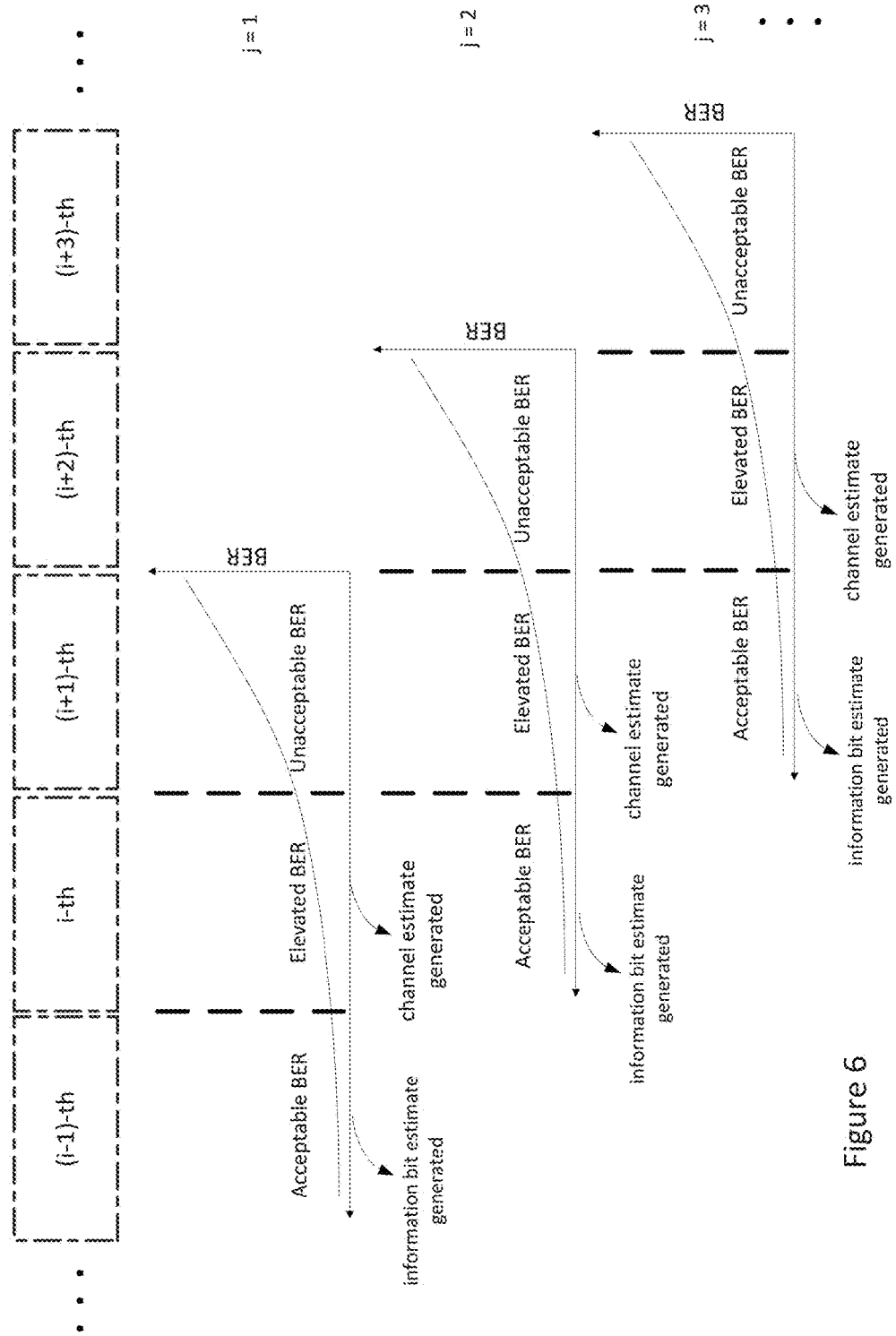
FIG. 6 illustrates three iterations of the method of FIG. 5 on an OFDM data packet.

FIG. 6 shows an example of three iterations of the method 500 during reception of an OFDM data packet. For simplification, the data packet in this example includes OFDM symbols (i−1), i, (i+1), (i+2) and (i+3) each lasting a single OFDM period. That is, in this example, (i−1), i, (i+1), (i+2) and (i+3) can also be treated as OFDM symbol index. A skilled person would appreciate that the method 500 may be applied to iterate on data packets having portions of different sizes (such as that shown in FIG. 4C). Also, to illustrate the relevant principle, only three iterations to be applied towards a middle portion of a data packet are shown. A skilled person would appreciate that more iterations before and/or after these iterations may be required depending on the length of the entire data packet.

At iteration j=1, OFDM symbols (i−1), i and (i+1) have been received. The method 500 is applied to the partially received data packet, including tracing backwards through a maximum-likelihood based path across firstly symbol (i+1), then symbol i and thereafter symbol (i−1). At this iteration, traceback outcomes corresponding to symbol (i+1) are disregarded. A channel estimation is generated based on traceback outcomes corresponding to symbol i (step 506), and an information bit estimate may be generated based on traceback outcomes corresponding to symbol (i−1) (step 508).

At iteration j=2, an additional OFDM symbol (i+2) has been received. The method 500 is applied to the partially received data packet, including tracing backwards through a maximum-likelihood based path across firstly symbol (i+2), then symbol (i+1) and thereafter symbol i. At this iteration, traceback outcomes corresponding to symbol (i+2) are disregarded. An updated channel estimation is generated based on traceback outcomes corresponding to symbol (i+1) (step 506), and an information bit estimate is generated based on traceback outcomes corresponding to symbol i (step 508).

At iteration j=3, a further OFDM symbol (i+3) has been received. The method 500 is applied to the partially received data packet, including tracing backwards through a maximum-likelihood based path across firstly symbol (i+3), then symbol (i+2) and thereafter symbol (i+1). At this iteration, traceback outcomes corresponding to symbol (i+3) are disregarded. A further updated channel estimation is generated based on traceback outcomes corresponding to symbol (i+2) (step 506), and an information bit estimate is generated based on traceback outcomes corresponding to symbol i+1 (step 508).

Now that embodiments of the present disclosure are described, it should be apparent to the skilled person in the art that the described wireless receiver has the following advantages:

- Channel estimation can be commenced earlier since decoding outcomes generated during the earlier of the traceback process are used. This reduces the time lag in ultimately providing the estimates of the information bits.
- The earlier channel estimation also allows more time-relevant (i.e. less aged) channel estimates for use with decoding the received bits. In situations where the channel changes rapidly, for example, in a mobile environment, this facilitates more accurate decoding results.
- For the purposes of channel estimation, a data re-encoding step at the receiver is not necessary, since the traceback outcomes intrinsically include coded bit estimates for use by the channel estimator.

It will be understood that the invention disclosed and defined in this specification extends to all alternative combinations of two or more of the individual features mentioned or evident from the text or drawings. For example, a 4-state rate-12/convolutional coding scheme is described, other convolutional coding schemes may well be suitable. All of these different combinations constitute various alternative aspects of the invention.

What is claimed is:

1. A method of estimating a communications channel between a transmitter and a receiver, the method comprising:

receiving at the receiver a first sequence of bits representing a first sequence of coded symbols transmitted over the communications channel; and decoding the first sequence of coded symbols using maximum-likelihood based decoding including:

generating traceback outcomes by tracing backwards the first sequence of bits through a maximum-likelihood based traceback path, the traceback outcomes including a first portion associated with a first traceback depth and a second portion associated with a second traceback depth that is deeper than the first traceback depth;

generating a channel estimate of the communications channel based on the first portion of the traceback outcomes; and generating an estimate of at least some information bits coded in the first sequence of coded symbols based on the second portion of the traceback outcomes;

wherein generating the channel estimate of the communications channel commences after generation of the first portion of the traceback outcomes and before completion of the second portion of the traceback outcomes.

2. The method of claim 1 wherein the first portion is subject to a first information bit error rate (BER) and the second portion is subject to a second information BER that is lower than the first information BER.

3. The method of claim 1 further comprising disregarding any estimate of the information bits generated based on the first portion of the traceback outcomes.

4. The method of claim 1 wherein the traceback outcomes includes a third portion that is associated with a third traceback depth that is shallower than the second traceback depth, and that is subject to a third information BER that is higher than the first information BER, the method further comprising:

disregarding any estimate of information bits generated based on the third portion of the traceback outcomes; and disregarding any estimate of a transmitted coded symbol generated based on the third portion of the traceback outcomes.

5. The method of claim 1 wherein the step of generating a channel includes generating an estimate of at least one of the first sequence of transmitted coded symbols based on the first portion of the traceback outcomes.

6. The method of claim 1 wherein the step of generating a channel includes:

generating an estimate of information bits coded in the coded symbols based on the first portion of the traceback outcomes; and re-encoding the estimate of the information bits to form re-encoded symbols.

7. The method of claim 1 further comprising:

receiving at the receiver a second sequence of bits representing a second sequence of coded symbols and including at least part of the first sequence of bits;

decoding the second sequence of coded symbols using maximum-likelihood based decoding including:

generating further traceback outcomes by tracing backwards the second sequence of bits through a maximum-likelihood based traceback path, the further traceback outcomes including a fourth portion associated with a fourth traceback depth and a fifth portion associated with a fifth traceback depth that is deeper than the fourth traceback depth, generating an updated channel estimate of the communications channel based on the fourth portion of the further traceback outcomes; and generating an estimate of at least some information bits coded in the second sequence of coded symbols based on the fifth portion of the further traceback outcomes.

8. The method claim 7 further comprising disregarding any estimate of the information bits generated based on the fourth portion of the further traceback outcomes.

9. The method of claim 7 wherein the further traceback outcomes includes a sixth portion that is associated with a sixth traceback depth that is shallower than the fourth traceback depth, and that is subject to a sixth information BER that is higher than the fourth information BER, the method further comprising:

disregarding any estimate of information bits generated based on the sixth portion of the further traceback outcomes; and disregarding any estimate of a transmitted coded symbol generated based on the sixth portion of the further traceback outcomes.

10. The method of claim 1 wherein the second traceback depth is no less than approximately 7N, where N is the encoding constraint length.

11. The method of claim 7 wherein the fifth traceback depth is no less than approximately 7N, where N is the encoding constraint length.

12. The method of claim 1 wherein each of the first portion and the second portion correspond to one or more OFDM symbols.

13. The method of claim 7 wherein each of the fourth portion and the fifth portion correspond to one or more OFDM symbols.

14. The method of claim 1 wherein the first sequence of coded bits are encoded using a convolutional code.

15. The method of claim 7 wherein the second sequence of coded bits are encoded using a convolutional code.

16. The method of claim 1 further comprising generating soft bits based the first sequence of bits for the decoding.

17. The method of claim 7 further comprising generating soft bits based the second sequence of bits for the decoding.

18. An apparatus for estimating a communications channel between a transmitter and a receiver, the apparatus comprising:

an input configured to receive a first sequence of bits representing a first sequence of coded symbols transmitted over the communications channel;

a decoder configured to decode the first sequence of coded symbols using maximum-likelihood based decoding by at least:

generating traceback outcomes by tracing backwards the first sequence of bits through a maximum-likelihood based traceback path, the traceback outcomes including a first portion associated with a first traceback depth and a second portion associated with a second traceback depth that is deeper than the first traceback depth; and generating an estimate of at least some information bits coded in first sequence of the coded symbols based on the second portion of the traceback outcomes, and a channel estimator configured to generate a channel estimate of the communications channel based on the first portion of the traceback outcomes, wherein generation of the channel estimate of the communications channel commences after generation of the first portion of the traceback outcomes and before completion of the second portion of the traceback outcomes.

* * * * *